United States Patent [19]

Lacy

[11] 4,272,767
[45] Jun. 9, 1981

[54] DISPLAY SYSTEM FOR DISPLAYING INFORMATION IN THE FORM OF A HORIZONTALLY ORIENTED CURVE ON A RASTER-TYPE CRT

[75] Inventor: Robert H. Lacy, Bartlesville, Okla.

[73] Assignee: Phillips Petroleum Company, Bartlesville, Okla.

[21] Appl. No.: 52,294

[22] Filed: Jun. 26, 1979

[51] Int. Cl.³ .............................................. G08B 5/36
[52] U.S. Cl. .................................. 340/722; 340/747; 340/792
[58] Field of Search ............... 340/747, 753, 754, 722, 340/726, 728

[56] References Cited

U.S. PATENT DOCUMENTS

| | | | |
|---|---|---|---|
| 3,678,498 | 7/1972 | Nagamatsu et al. | 340/722 |
| 3,686,662 | 8/1972 | Blixt et al. | 340/747 X |
| 3,725,901 | 4/1973 | Lehari et al. | 340/722 |
| 3,778,811 | 12/1973 | Gicca et al. | 340/747 X |
| 3,781,850 | 12/1973 | Gicca et al. | 340/747 |
| 3,786,476 | 1/1974 | Graves et al. | |
| 3,792,464 | 2/1974 | Hamada et al. | 340/747 |
| 3,969,716 | 7/1976 | Roberts | 340/728 |
| 4,068,310 | 1/1978 | Friauf | 340/722 X |
| 4,117,473 | 9/1978 | Habeger et al. | |
| 4,193,122 | 3/1980 | Bowers | 340/722 X |
| 4,208,723 | 6/1980 | Lecklider | 340/747 X |

OTHER PUBLICATIONS

Serck Controls Chromimic 168 Visual Display Terminal Product Data Sheet PDS 10/4, issue 2; Feb. 12, 1976.
Serck Controls Chromimic 168 Visual Display Terminal Graph Package Option Product Data Sheet PDS 10/4-GP issue 1; Jan. 5, 1977.

Primary Examiner—David L. Trafton

[57] ABSTRACT

A horizontally oriented curve is produced on a raster-type cathode-ray tube display by storing curve data words in a memory. The curve data word is representative of the height at which a dot is to be placed on the cathode-ray tube screen. The horizontal position of the dot is dictated by the position of the data word in the memory. The data words are read out of the memory in response to a horizontal address and the data words are compared to a vertical address. Where the data word is equal to the vertical address a dot is illuminated at a particular horizontal and vertical position. The curve is updated by writing a new data word into the memory and moving all of the existing data words one position in the memory. The data in the reconfigured memory is then displayed. Provision is also provided for filling in vertical gaps in the horizontal curve to provide a smooth curve.

16 Claims, 9 Drawing Figures

DISPLAY SYSTEM FOR DISPLAYING INFORMATION IN THE FORM OF A HORIZONTALLY ORIENTED CURVE ON A RASTER-TYPE CRT

This invention relates to method and apparatus for displaying data on a raster-type cathode-ray tube (CRT). In one aspect this invention relates to method and apparatus for displaying trend data, which may vary as a function of time, on a raster-type CRT. In another aspect this invention relates to method and apparatus for filling in gaps between data points on a curve display on a raster-type CRT.

Raster-type CRT's are commonly used to display information. This information will generally be in alphanumeric form but also may be in the form of either vertically or horizontally oriented curves. In many applications, the display system incorporating the raster-type CRT is utilized to provide information concerning a process to an operator who is controlling the process. In processes such as chemical manufacturing processes, a number of variables concerning the process such as the temperature of a reaction, pressure at which a reaction is being carried out, flow rate of the feeds to a reaction or flow rate of the effluent flowing from a reaction are of vital importance to the operator. Without a continuing, updated knowledge of these parameters process control is virtually impossible. Horizontally oriented curves on a raster-type CRT provide a convenient method for providing this information to an operator. A visual display, usually in color, can provide information which allows the operator to react to process condition changes in time to avoid process upsets.

It is, however, necessary that the process data displayed in the form of horizontally oriented curves on a raster-type CRT be updated periodically to provide current information to the operator. The so-called "trend" of the process variables must be displayed if the information is to be useful. The change in factors such as temperature, pressure or flow rates as a function of time is the trend data which must be provided to the operator. It is therefore an object of this invention to provide method and apparatus for displaying trend data, which may vary as a function of time, on a raster-type CRT.

In general, each horizontal position on a raster-type CRT may have only one data point for each curve on the CRT. This may result in discontinuities in a horizontally oriented curve which are visually unpleasing and may be misleading to the person viewing the data. It is thus another object of this invention to provide method and apparatus for filling in vertical gaps between data points on a horizontally oriented curve displayed on a raster-type CRT.

In accordance with the present invention, method and apparatus is provided whereby a trend curve composed of a first desired number of points or positions, is displayed horizontally across a raster-type CRT screen. A memory is utilized for data storage. Memory locations are numbered consecutively from 0 to a number corresponding to the first desired number of points. Each memory location corresponds to a horizontal position where a dot may be displayed. The data stored in a memory location is the vertical position of the dot to be displayed. Thus, the horizontal position of a data point to be displayed is determined by the location in memory that the point is stored. The vertical position of a data point is determined by the value stored in the memory location.

Each point may have a value of 0 which corresponds to a vertical position at the bottom of the screen to a second desired number which corresponds to a vertical position at the top of the screen. Data is read into the memory at a horizontal position corresponding to the first desired number of points. This data may have a value of 0 to the second desired number which corresponds to the vertical position at which the dot is to be displayed. As more data is read into the memory, the data at the horizontal position corresponding to the first desired number of points is shifted into the next lower horizontal position in sequence and a new data point is read into the horizontal position corresponding to the first desired number of points in the memory. This process is continued until each of the horizontal positions in the trend curve memory has a vertical position of a data point associated therewith.

Data is displayed by reading out the data in horizontal position 1 and comparing this data to the state of a counter which is counted down from the second desired number to 0. When the counter state is equal to the data word, a dot is illuminated. Thus, if 238 is stored in horizontal position 3, a dot will be illuminated at horizontal position line 3 and vertical position line 238. After all horizontal positions have been compared to the state of the counter, the counter is decremented and the comparison is repeated for the new state of the counter. This process continues until all horizontal positions have been compared against all vertical positions.

To provide trend data, a new data point is written into memory at the horizontal position corresponding to the first desired number of points. All data in the memory is shifted to the next lower number location and thus the data in memory location 1 is lost. The data in the memory is thus updated and is redisplayed causing the horizontally oriented curve on the CRT to shift as a function of time. This process can be continued indefinitely with new data points being written into the memory location corresponding to the first desired number of points and the data in memory being shifted to the next lower number location. This provides a scrolling effect for the trend curve and provides a convenient method of displaying process changes as a function of time.

The comparison of the data in the memory to the vertical position count is utilized to illuminate specific dots on the CRT. A dot is illuminated when the data in the memory is equal to the vertical position count. Since each horizontal position can have only one data point for each curve, the horizontally oriented curve is filled in by comparing the data in the memory to the vertical position count to determine if the data in the memory is greater than or less than the vertical position count. A transition from greater than to less than or from less than to greater than is utilized to fill in the horizontally oriented curve to provide a pleasing appearance and to provide a process curve which is not misleading to an operator.

Other objects and advantages of the invention will be apparent from the foregoing brief description of the invention and from the claims as well as from the detailed description of the drawings in which:

The present invention is described in terms of a system in which the horizontally oriented curve is composed of 240 points or positions. Each point may have a value of 0 which corresponds to the bottom of the screen to 240 which corresponds to the top of the screen. The invention is not limited to a curve composed of 240 points and is not limited to a curve whose vertical values can range from 0 to 240 but is rather applicable to any horizontally oriented curve generating system in which any number of points are utilized to make up the curve and the points which make up the curve can have any number of vertical values.

For the sake of convenience, the present invention is described in terms of the generation of only one horizontally oriented curve. However, the invention is applicable to generating a plurality of horizontally oriented curves on the same CRT screen. If multiple curves are displayed a substantial portion of the logic may be shared by the curve. This is a substantial economic advantage.

Values of 0 to 240 for the points on the curve are referred to repeatedly. These numbers are decimal equivalents of binary numbers. For example, a 0 will actually be 00000000 and 240 will be 11110000. Thus, if 8 address lines are utilized, 240 will generally be transmitted by setting the 4 most significant bit address lines high and setting the 4 least significant bit address lines low.

Figure 1:
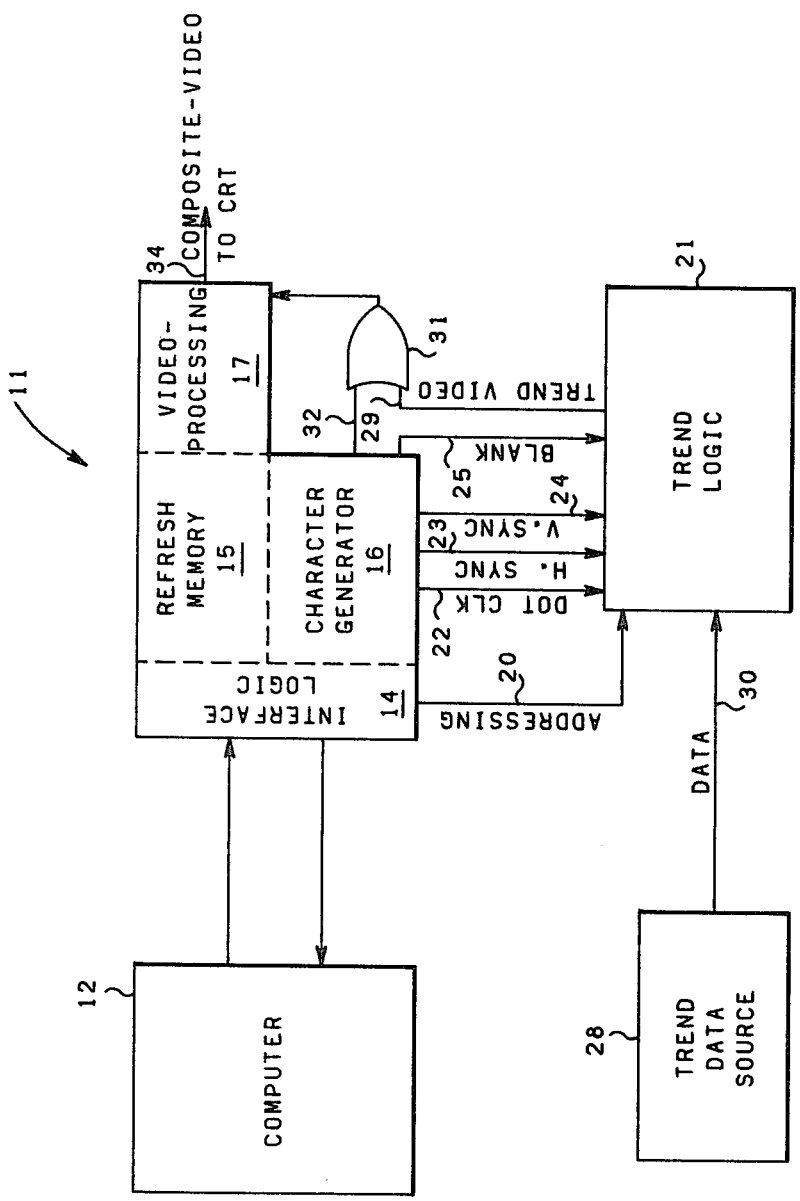
FIG. 1 is a block diagram of a conventional CRT terminal having the trend logic of the present invention incorporated therewith.

Referring now to the drawings and in particular to FIG. 1, there is illustrated a conventional CRT terminal 11 which incorporates a logic interface 14 to the computer 12, a refresh memory 15, a character generator 16, and video processing 17. These types of terminals are well known in the art and are generally used to generate an alphanumeric display on a CRT.

The trend logic 21 is utilized to generate horizontally oriented curves which can provide information concerning a particular variable as a function of time. The conventional CRT terminal 11 provides the dot clock 22, the horizontal sync signal 23, the vertical sync signal 24 and the blanking signal 25 to the trend logic. Required addressing is provided via signal line 20 from the interface logic 14 to the trend logic 21. This addressing may be provided directly from computer 12 if desired. A trend data source 28 is utilized to provide trend data to the trend logic 21. The trend data source 28 may be computer 12, if desired.

The trend logic processes the trend data provided from the trend data source 28 and provides a trend video signal 29 to the OR gate 31. The OR gate 31 is also provided with alphanumeric data from the character generator 16 by means of signal line 32. The output from the OR gate 31 is provided as an input to the video processing 17. The video processing 17 provides a composite video output signal 34 to a CRT. Use of the OR gate 31 allows the trend video and the alphanumeric display to be displayed simultaneously.

Figure 2:
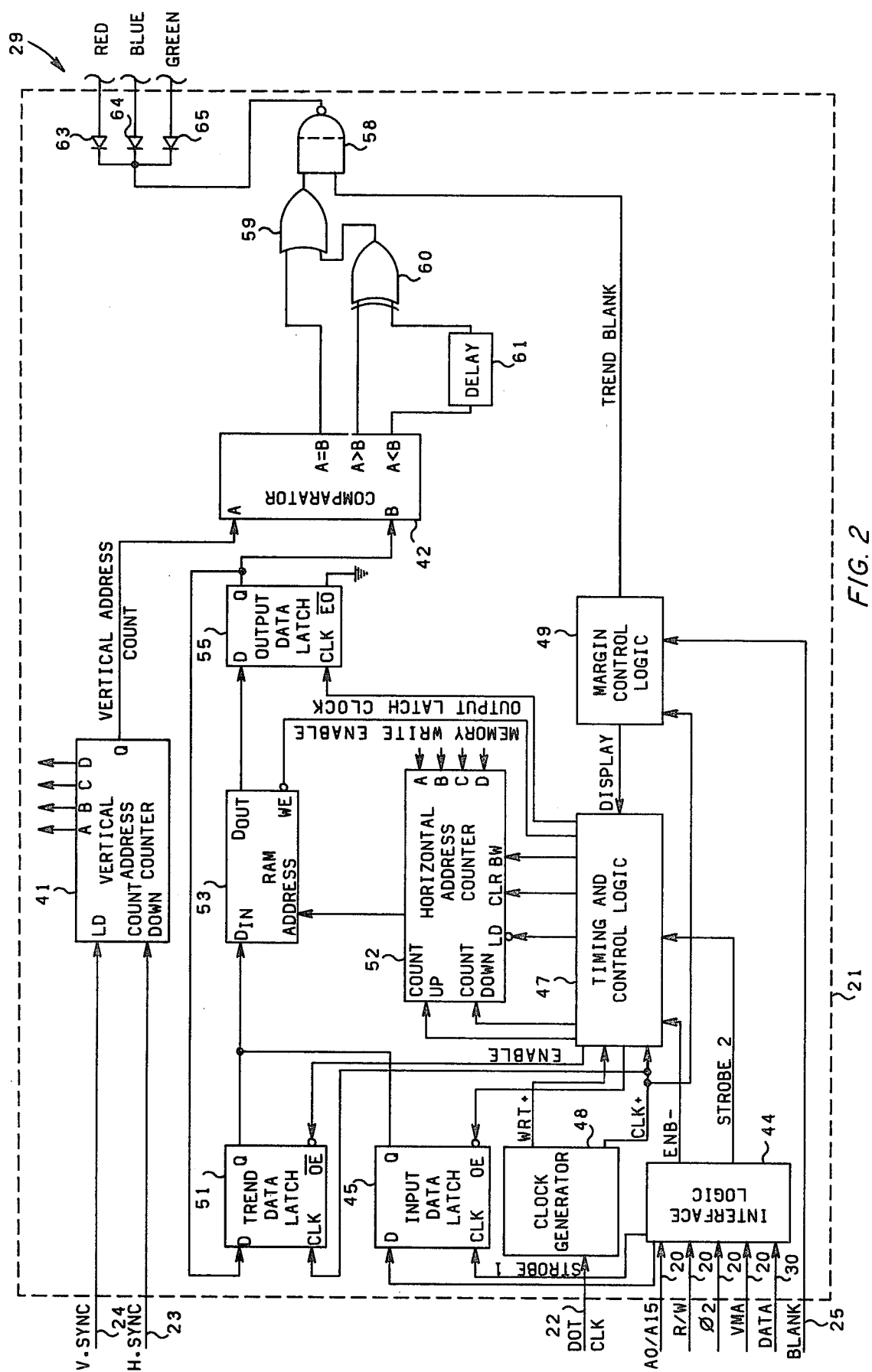
FIG. 2 is a block diagram of the trend logic of the present invention.

The interface logic 27 and the trend logic 21 illustrated in FIG. 1 are more fully illustrated in FIG. 2. Referring now to FIG. 2, the vertical sync pulse 24 is provided to the load input of the vertical address counter 41. The horizontal sync pulse 23 is provided to the countdown input of the vertical address counter 41. The A, B, C and D data inputs of the vertical address counter 41, which is made up of two chips each having A, B, C and D data inputs, are hardwired to be representative of 240. The vertical address count is provided from the Q outputs of the vertical address counter 41 to the A input of a comparator 42. In operation, the vertical sync pulse 24 loads the binary 240 into the vertical address counter and then the vertical address counter is counted down by the horizontal sync pulse 23. Thus the Q output from the vertical address counter 41 will count down from 240 to 0 and then will be reset to 240.

The interface logic 44 is provided with address and command signals from the interface 14 illustrated in FIG. 1. These address and command signals could be provided directly from computer 12. A computer such as the 6800 Microprocessor manufactured by Motorola Semiconductor can supply the 16 address signals (AO-/A15), the read/write signals (R/W), the phase two clock signal ($\phi_2$) and the valid memory address signal (VMA). In response to the address and command signals, the interface logic provides both enabling pulses and strobe pulses. An enabling signal (ENB−) is provided to the timing and control logic 47. A strobe pulse (strobe 1) is provided from the interface logic 44 to the clock input of the input data latch 45. A second strobe pulse (strobe 2) is provided from the interface logic 44 to the timing and control logic 47.

The dot clock 22 is provided as an input to the clock generator 48. In response to the dot clock, the clock generator 48 generates two clock signals (WRT+ and CLK+) which are utilized extensively by the trend logic. The WRT+ clock signal is provided as input to the timing and control logic 47. The CLK+ clock signal is provided as an input to the timing and control logic 47, the margin control logic 49 and the trend data latch 51.

The horizontal address counter 52 is utilized to address the random access memory 53 in such a manner that the contents of the random access memory is read out from the random access memory 53 to the D input of the output data latch 55. The random access memory 53 is enabled by a memory write enable signal which is provided from the timing and control logic 47. Data is provided to the random access memory 53 from either the Q output of the trend data latch 51 or the Q output of the input data latch 45 depending upon which data latch is enabled.

The horizontal address counter 52 is controlled primarily from the timing and control logic 47. Either the countup input or the countdown input for the horizontal address counter 52 is enabled from the timing and control logic 47. The horizontal address counter can be loaded with a binary number representative of 240 using the A, B, C and D data inputs. Loading is controlled from the timing and control logic 47 which provides a control signal to the load input of the horizontal address counter 52. The horizontal address counter 52 can be cleared using another control signal from the timing and control logic 47. The borrow output from the horizontal address counter 52 is provided as an input to the timing and control logic 47.

The timing and control logic 47 also provides enabling signals to the output enable of the trend data latch 51 and the output enable of the input data latch 45. A clock signal is provided from the timing and control logic to the clock input of the output data latch 55. The timing and control logic is provided with the display signal from the margin control logic 49 which also provides the trend blank signal to the open collector NAND gate 58.

The Q output from the output data latch 55 is supplied to the B input of the comparator 42 and is also supplied to the data input of the trend data latch 51. The A=B output of the comparator 42 is provided as a first input to the OR gate 59. The A>B output from the comparator 42 is provided as an input to the EXCLUSIVE OR gate 60. The A<B output from the comparator 42 is provided through the delay 61 as a second input to the EXCLUSIVE OR gate 60. The output from the EXCLUSIVE OR gate 60 is provided as a second input to the OR gate 59. The EXCLUSIVE OR gate 60 and the delay 61 together make up the vertical fill-in logic.

The output from the OR gate 59 is provided as an input to the open collector NAND gate 58. The output from the open collector NAND gate 58 is provided as the trend video signal 29. Either red, blue or green video, or a combination, can be provided depending on which of the diodes 63-65 are connected.

Figure 3:
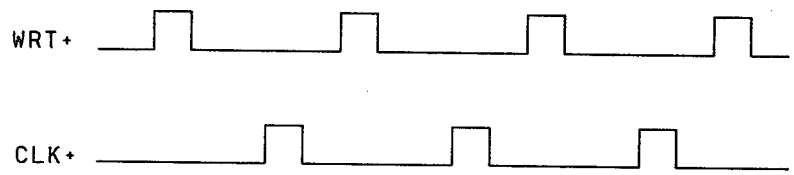
FIG. 3 is a timing diagram for shifting data in the memory of the trend logic.

FIG. 3 will be referred to to illustrate the manner in which data is stored in the random access memory 53. FIG. 3 illustrates a timing diagram for the WRT+ clock and the CLK+ clock which are generated by the clock generator 48. When it is desired to store data to be displayed in the random access memory 53, the new data word, which will be representative of a binary number which can range from 0 to 240, is stored in the input data latch 45. The horizontal address counter 52 is preset to 240. The random access memory 53 is then enabled and the contents of random access memory 53 location 240 is stored in output data latch 55. This occurs on the leading edge of the WRT+ clock. After the contents of memory location 240 have been written into the output data latche 55, the trend data latch 51 is enabled during the time that the WRT+ clock is high to read the contents of the trend data latch 51 into the random access memory at location 240. After this has occurred, the contents of the output data latch 55 are stored in the trend data latch 51. This occurs at the leading edge of the CLK+ clock. The horizontal address counter 52 is then counted down to 239 at the trailing edge of the CLK+ clock. The foregoing steps are then repeated until a borrow output from the horizontal address counter 52 occurs indicating that the horizontal address counter 52 has been counted down to 0. The horizontal address counter is then again preset to 240 and the trend data latch 51 is disabled. The input data latch 45 is enabled and the contents of the input data latch 45 are then written into the random access memory 53 at location 240.

If there was no data in the random access memory 53 at the beginning of the cycle, then only the data word supplied from the input data latch will be present in the random access memory at location 240. When another data word is provided the old data word in location 240 will be moved to location 239 and a new data word will be written into location 240. If the random access memory 53 is full, then the new data word is written into the random access memory 53 at location 240 and the data word which resided at location 1 in the random access memory 53 will be lost. In this manner, a scrolling-effect or trending of the data curve is provided by relocating data in the random access memory 53.

To display the data stored in the random access memory 53, the horizontal address counter 52 is configured to count up from 0 to 240. The vertical address count supplied to the A input of the comparator 42 will be representative of the video line count for the CRT.

The contents of the random access memory 53 for location 0 through 240 are read out for each horizontal video line. Thus, when the vertical address count is representative of 240 all of the memory locations 0 through 240 will be read out of the random access memory 53. In like manner, when the vertical address count is equal to 239 all of the memory locations in the random access memory 53 will be read out. The data from the random access memory 53 is provided through the output data latch 55 to the B input of the comparator 42. When a point on the CRT screen is to be illuminated, the A and B inputs to the comparator will be equal and the A=B output of the comparator will be true. Thus, if the vertical address count signal is equal to 240 and a 240 is present in memory at memory location 3, line 240 will be illuminated at the third horizontal position on the CRT screen. Because the random access memory 53 is cycled through all horizontal addresses during each video line, a point will be displayed somewhere on the CRT screen for each horizontal position. The data stored in the RAM may be greater than 240 in which case the point will not appear on the screen.

The A=B signal from the comparator 42 is OR'ed with the output signal from the EXCLUSIVE OR gate 60 and is then provided as the video trend data to the video processing 17 illustrated in FIG. 1.

Figure 4:
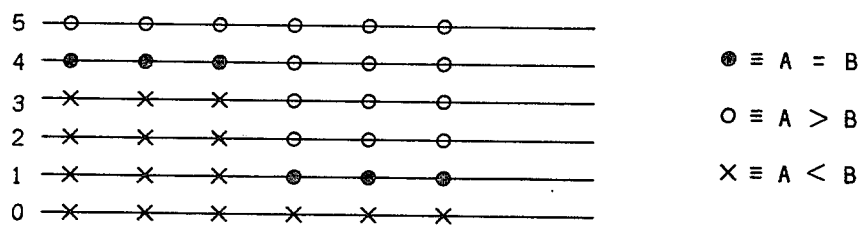
FIG. 4 is a illustration of the signals generated by the vertical fill-in logic.
Figure 4:
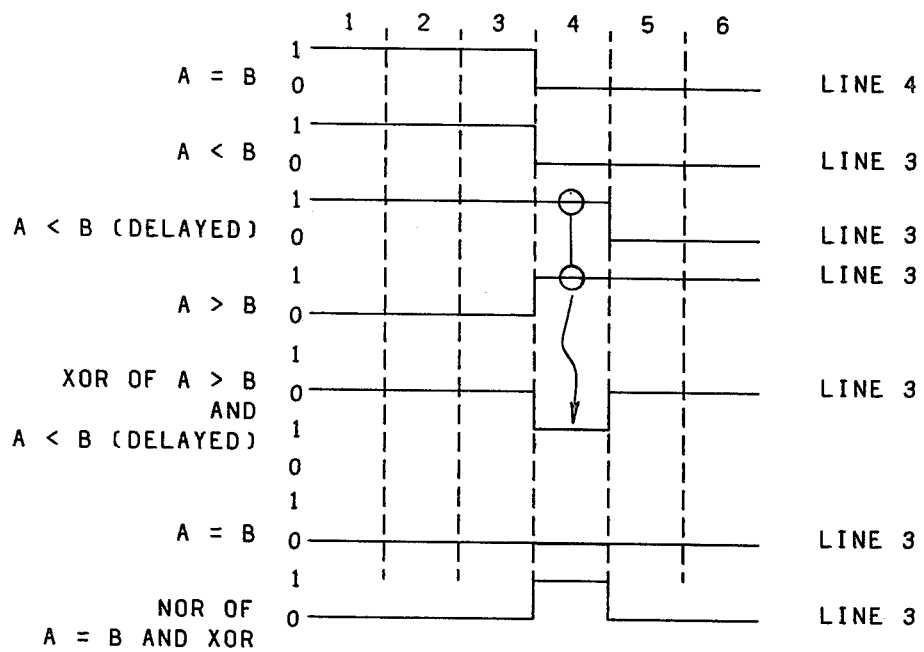

As has been previously stated, vertical fill-in logic is provided to prevent discontinuities from appearing in the horizontal curve. The vertical fill-in logic utilized in the present invention will be described in conjunction with FIG. 4. Referring to FIG. 4, a sample of a display is illustrated in which 6 dots are illuminated. The first three positions on scan line 4 are illuminated and the last three positions on scan line 1 are illuminated. Without vertical fill-in logic, a discontinuity would be present by th fact that no dots are illuminated on either line 3 or line 2.

Lines 3 and 4 will be utilized to illustrate the vertical fill-in logic. The A=B output for line 4 will be high for positions 1, 2 and 3 and will be low for positions 4, 5 and 6. In like manner, the A<B output of the comparator 42 for line 4 will be high for positions 1, 2 and 3 and will be low for positions 4, 5 and 6. The delayed A<B signal for line 3, which is supplied from the delay 61 to the exclusive OR gate 60, will be high for positions 1, 2, 3 and 4 and will be low for positions 5 and 6 as is illustrated in FIG. 4. The A>B output from the comparator 42 for line 3 will be low for positions 1, 2 and 3 and will be high for positions 4, 5 and 6. The output signal from the EXCLUSIVE OR gate 60 will thus be high for positions 1, 2, 3, 5 and 6 and will be low only for position 4 as is illustrated in FIG. 4. The A=B output from the comparator 42 will always be low for line 3. Thus the output of the NOR gate 59 will be high only for position 4 of line 3 and position 4 of line 3 will be illuminated by the fill-in logic. A similar procedure is followed for line 2 and position 4 of line 2 would in like manner be illuminated to provide a continuous appearance for the curve displayed on the CRT.

Figure 5:
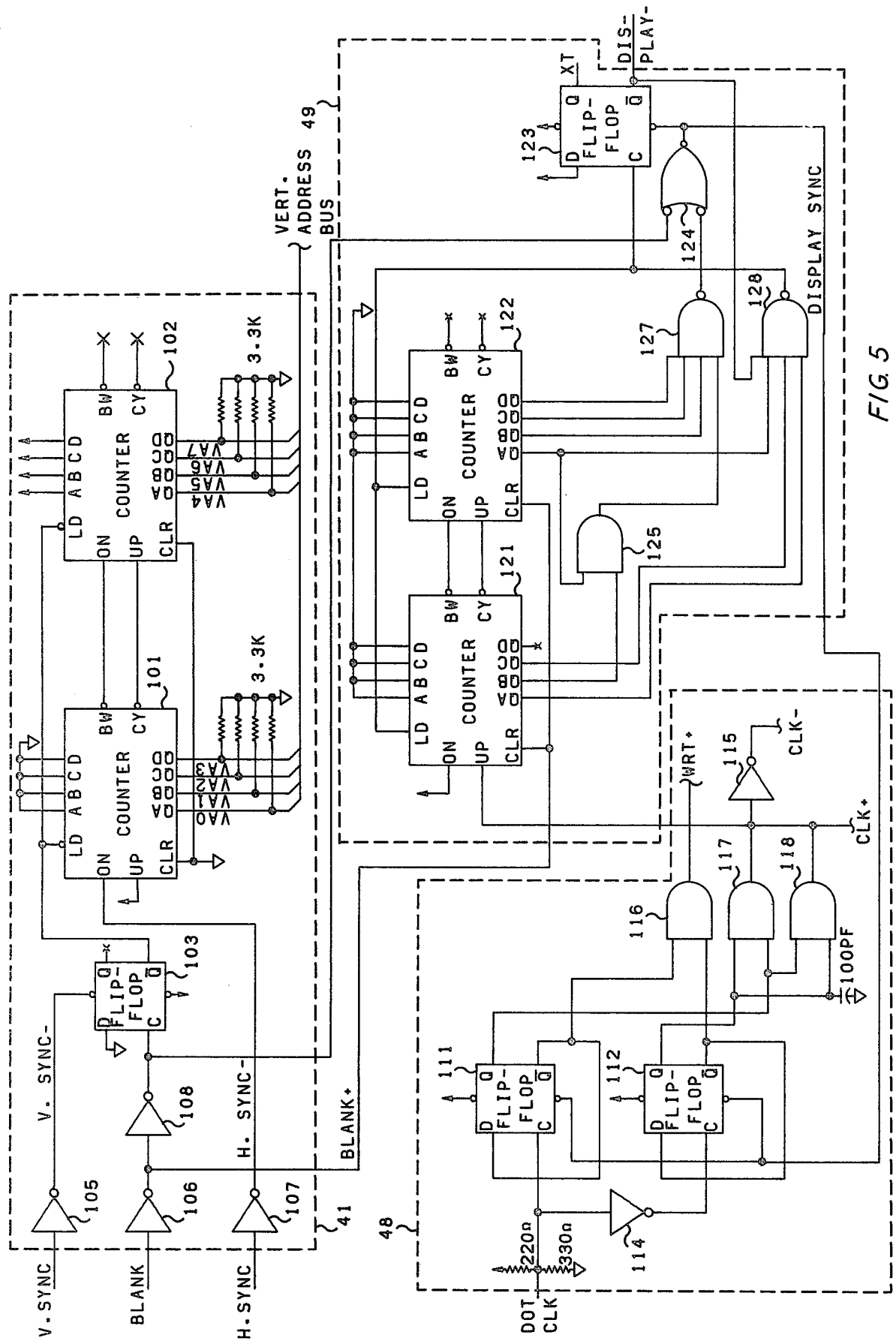
FIG. 5 is a schematic diagram of the vertical address counter, clock generator and margin control logic illustrated in FIG. 2.

The broad concepts of the present invention have been described with reference to FIGS. 1–4. FIGS. 5–9 present schematic diagrams of the blocks illustrated in FIG. 2. These schematic diagrams are presented to provide a preferred embodiment of the various blocks illustrated in FIG. 2. Other aspects of the invention will also be described in conjunction with the description of FIGS. 5–9. An arrow is utilized in FIGS. 5–9 to indicate that the particular logic node or component is tied to +5 volts. Referring now to FIG. 5, the vertical address counter 41, the clock generator 48 and the margin control logic 49 are illustrated. The vertical address counter 41 consists of two counters 101 and 102 together with the associated resistors, flip-flop 103 and inverters 105–108. The first vertical sync pulse following power-up of the trend logic sets the vertical sync flip-flop 103. The Q-bar output of the flip-flop 103 presets the eight-stage counter made up of counters 101 and 102 to 240. The count on the counters 101 and 102 will remain at 240 until flip-flop 103 is reset by the trailing edge of the blank signal. The counter made up of counters 101 and 102 will then be decremented by the horizontal sync pulse at the end of each video scan line.

The clock generator 48 consists of the flip-flops 111 and 112 together with inverters 114 and 115 and AND gates 116–118. The two flip-flops 111 and 112 are connected for toggle operation. Because they are clocked on opposite edges of the dot clock, there is a 90° phase difference in the output wave forms from the flip-flops 111 and 112. The flip-flops 111 and 112 are synchronized each horizontal line by direct resetting with a signal derived from BLANK. The outputs of the flip-flops 111 and 112 are ANDed to create the wave forms required by the trend logic circuitry. The margin control logic 49 consists of the counters 121 and 122 together with flip-flop 123, AND gate 124 and 125 and NAND gates 127 and 128. The trend display has left and right margins of approximately 3 alphanumeric character spaces. These margins are controlled by flip-flop 123. The margin counters 121 and 122 and the flip-flop 123 are held in the reset state during the blank period. At the end of blank the counters 121 and 122 are incremented by CLK+ until a count of 21 is detected at the output of NAND gate 128. This sets the flip-flop 123 and loads 0 into the counters 121 and 122. The counters 121 and 122 are incremented until a count of 242 is detected at the output of NAND gate 127. This resets the flip-flop 123.

Figure 6:
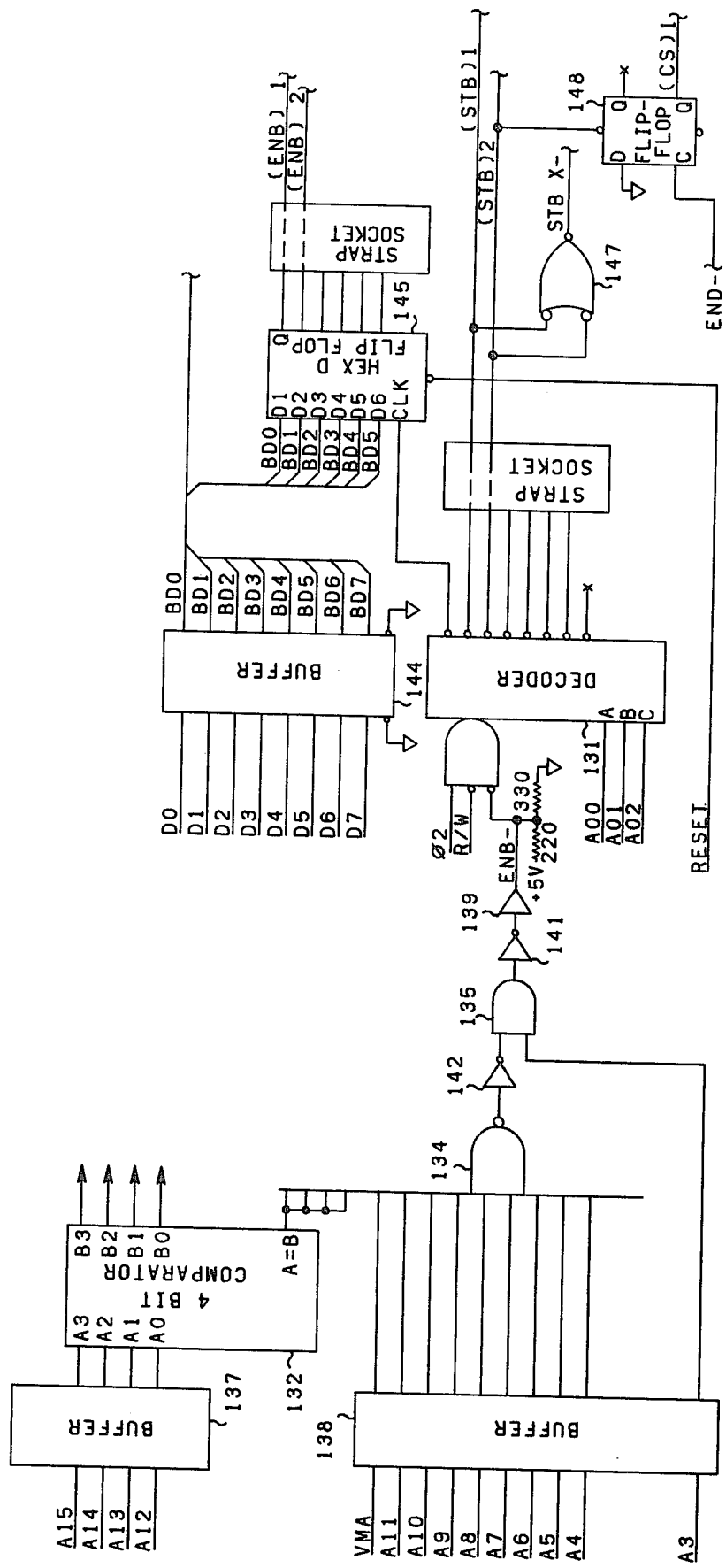
FIG. 6 is a schematic diagram of the interface logic illustrated in FIG. 2.

The interface logic 44 is illustrated in FIG. 6. This logic controls the enabling of the trend curve and the loading of data into the random access memory 53. The address and command bus from the computer is partially decoded to provide the ENB- signal to the decoder 131. This partial decoding is accomplished by using the four bit comparator 132, the NAND gate 134 and the AND gate 135. Required buffering or inversion is provided by the buffers 137, 138 and 139 and inverters 141 and 142. The phase 2 clock, R/W, ENB-, and the A0–A2 address bits are decoded using the decoder 131. The data from the computer is buffered by the buffer 144. The buffered data in combination with an output from the decoder 131 and the reset signal from the computer are provided to the hex D flip-flop 145 which is utilized to provide the enabling signals ENB 1 and ENB 2. The data is also provided on the buffered data bus to the required data latches. The AND gate 147 and the flip-flop 148 are utilized to generate required strobe and clock signals based on the outputs from the decoder 131. The signals ENB 2 and STB 2 are utilized for a second trend curve which has been omitted for clarity.

Figure 7:
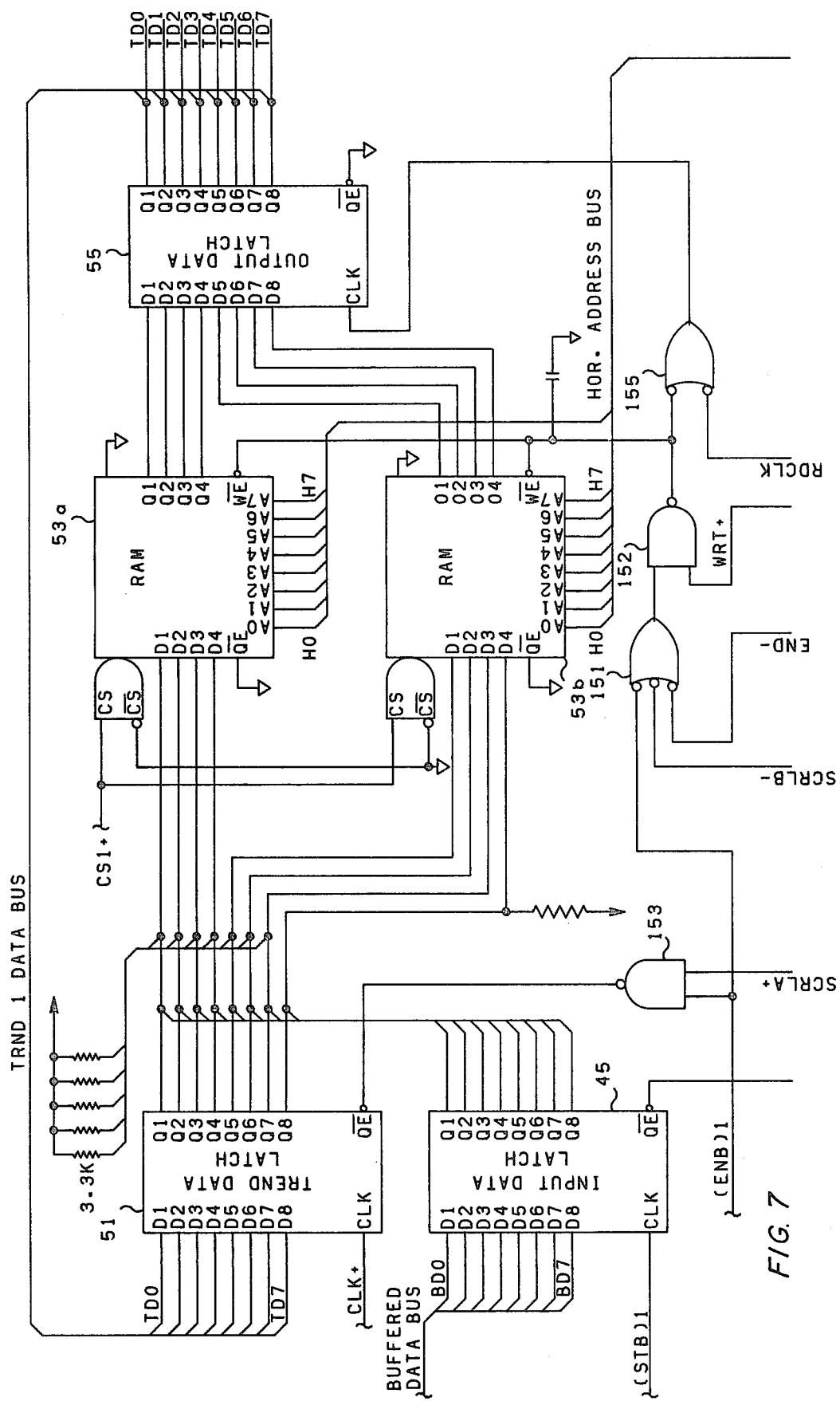
FIG. 7 is a schematic diagram of the trend data latch, input data latch, output data latch and random access memory illustrated in FIG. 2.

Referring now to FIG. 7, the trend data latch 51, the input data latch 45 and the output data latch 55 are illustrated together with the random access memory 53 which is made up of the two random access memories 53a and 53b. Triple input NAND gate 151, NAND gates 152 and 153 and AND gate 155 are also utilized. The data latches and the random access memory operate as has been previously described in detail.

Figure 8:
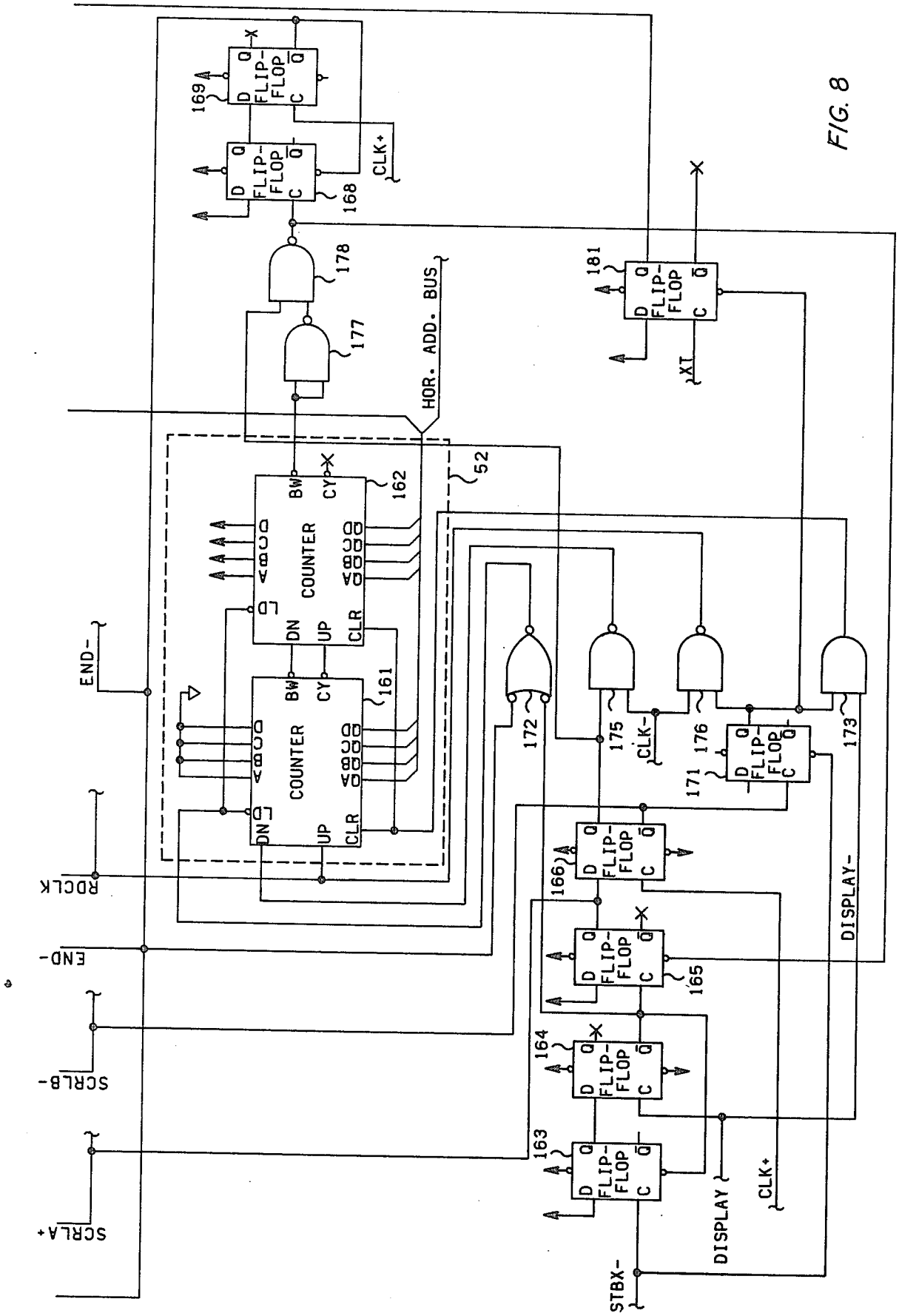
FIG. 8 is a schematic diagram of the timing and control logic and horizontal address counter illustrated in FIG. 2.

Referring now to FIG. 8, the horizontal address counter 52 which is made up of counters 161 and 162 is illustrated. The timing and control logic 47 is also illustrated as the remaining portion of FIG. 8. The timing and control logic is organized as a shift register sequencer which is composed of the four flip-flop stages 163–166 and flip-flop stages 168 and 169. The flip-flop 171, the AND gate 172 and 173 and the NAND gates 175–178 are also utilized. STBX- is utilized to start the timing and control logic when a new data point is to be added to the trend curve. STBX- clears flip-flop 171 which, in turn, clears flip-flop 181. The positive edge of STBX- sets the Q output of flip-flop 163. The display minus signal shifts the Q output of flip-flop 163 into flip-flop 164. The Q-bar output of flip-flop 174 will go low for one complete horizontal line period (63.5 microsecond). The Q-bar output from the flip-flop 164 resets flip-flop 163 and through the AND gate 172 presets the horizontal address counter made up of counters 161 and 162 to 240. The load signal disables the clock internally on the counters 161 and 162 so the counters 161 and 162 remain at 240. The trailing edge of the Q-bar output from flip-flop 164 sets the Q output of the flip-flop 165. This signal, which is referred to as SCRL A+, enables the tristate outputs of the trend data latch 51. SCRL A+ is synchronized to CLK+ by the Q output of flip-flop 166 which generates scroll B (SCRL B−). Scroll B enables the down count to the counter 161, enables the borrow output from NAND gate 178, and enables the WRT+ clock to the random access memory 53. The complement of WRT+ is used to strobe memory data into the output data latch 55.

Referring now to both FIG. 7 and FIG. 8, with the address counter 52 preset to 240, the first WRT+ pulse is routed through NAND gate 152 and AND gate 155 to the clock input of the output data latch 55. The leading edge of the WRT+ pulse stores the contents of memory location 240 in the output data latch 55. The WRT+ pulse is inverted by the NAND gate 152 and applied to the write enable input of the random access memory 53 which causes the contents of the trend data latch to be written into memory location 240.

The leading edge of the CLK+ pulse, which occurs approximately 50 nanoseconds after the end of WRT+, transfers the contents of the output data latch 55 into the trend data latch 51. The horizontal address counter 52 is decremented by the leading edge of CLK+. At this time the original contents of memory location 240 are in the trend data latch 51 and the contents of memory location 239 are available at the input of the output data latch 55. The next complete cycle of WRT+ and CLK+ will place the original contents of 240 into location 239 and the original contents of 239 into the trend data latch 51. This process continues until all memory locations have been rewritten.

During the first clock after the horizontal address counter 52 has reached 0, a borrow (BW-) output will occur at the borrow output of the counter 162. The borrow signal is gated through NAND gate 177 and NAND gate 178 to set the flip-flop 168. The borrow signal also resets flip-flop 165 which disables the tristate outputs of the trend data latch 51. The setting of the Q output of flip-flop 168 will cause the Q output of flip-flop 169 to become true for one complete cycle of CLK+. The tristate outputs of the input data latch 45 are enabled by the Q output from flip-flop 169 which also presets the horizontal address counter 52 to 240 and enables WRT+ for one cycle. During this cycle, the contents of the input data latch 45 are written into memory location 240. This completes the operation of writing data from the computer into the random access memory 53. As has been previously stated, the scrolling operation consists of relocating data in the random access memory 53 and always writing new data into memory location 240. The memory locations are not otherwise addressable.

Figure 9:
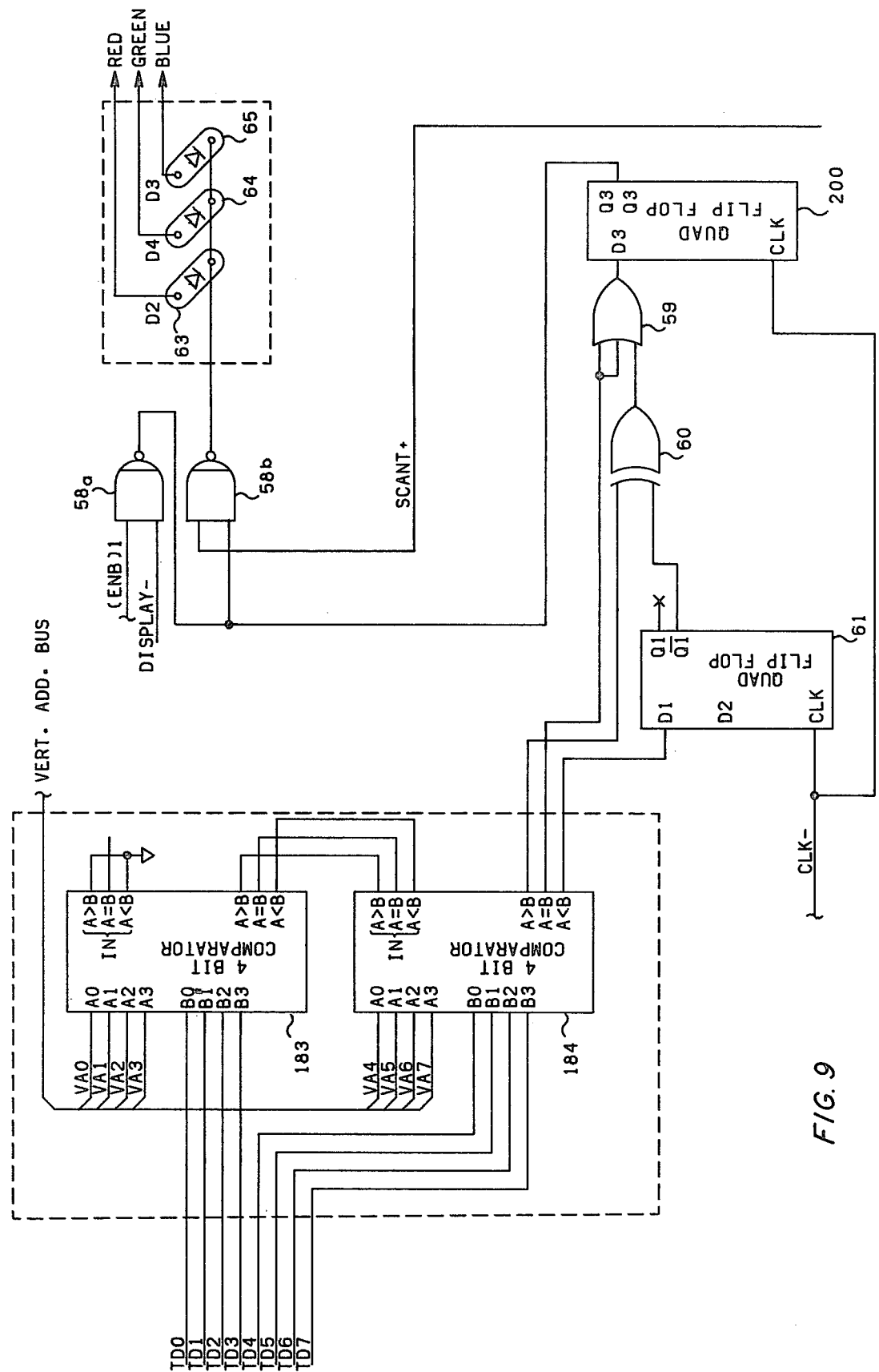
FIG. 9 is a schematic of the comparator and vertical fill-in logic illustrated in FIG. 2.

Referring now to FIG. 9, the comparator 42 which is made up of comparators 183 and 184 is illustrated. The delay 61, the exclusive OR gate 60, the OR gate 59, the open collector NAND gates 58 and the diodes 63-65 are illustrated. The data latch 200 is utilized to resynchronize the data to prevent a ragged appearance due to propagation delays. The circuit components are utilized as has been described in detail in the description of FIG. 2.

Commercially available components which can be utilized in the circuits illustrated in FIGS. 5-9 are as follows:

| | |
|---|---|
| Four bit comparator 132, 183 and 184 | 74LS85 National Semiconductor |
| NAND Gate 134 | 74LS133 Texas Instruments |
| Buffers 137, 138 and 144 | 74LS244 Texas Instruments |
| Counters 101, 102, 121, 122, 161 and 162 | 74LS193 National Semiconductor |
| Flip-flops 103, 111, 112, 123, 163-166, 168, 169, 171 and 181 | 74LS74 National Semiconductor |
| Decoder 131 | 74LS138 National Semiconductor |
| Hex D Flip-flop 145 | 74LS174 National Semiconductor |
| Data latches 51, 45 and 55 | 74LS374 National Semiconductor |
| Random access memories 53a and 53b | 93422 Fairchild Semiconductor |
| Quad D Flip-flop 61 | 74LS175 National Semiconductor |
| Inverters 142, 141, 114, 115, 106, 105, 107, and 108 | 74LS14 National Semiconductor |
| Buffer 139 | 74LS04 National Semiconductor |
| AND gates 135, 147, 116, 117, 118, 125, 172, and 173 | 74LS08 National Semiconductor |
| NAND gates 175, 176, 177, 178, 153, 152, and 155 | 74LS00 National Semiconductor |
| OR gate 59 | 74LS27 National Semiconductor |
| Exclusive OR gate 60 | 74LS86 National Semiconductor |
| 3 input NAND gate 151 | 74LS10 National Semiconductor |
| 4 input NAND gate 127 and 128 | 74LS20 National Semiconductor |

The invention has been described in terms of a preferred embodiment in which block diagrams as well as detailed schematics have been set forth. The invention is not limited to the detailed schematics. It is well known that there are many circuit configurations which can be utilized to perform specified functions. This is especially true with regard to many elements in the circuits which may be supplied by a plurality of manufacturers.

While the invention has been described in terms of the presently preferred embodiment, reasonable variations and modifications are possible by those skilled in the art within the scope of the described invention and the appended claims.

That which is claimed is:

1. Apparatus for producing a horizontally oriented curve on a raster-type cathode-ray tube display, comprising:
   a cathode-ray tube;
   means for producing a raster on said cathode-ray tube having horizontal scans alternating with retraces;
   means for producing a new curve data point signal representative of the vertical height of a dot to be displayed on said cathode-ray tube;
   a memory means having a plurality of memory locations in sequence, each of said plurality of memory locations corresponding to a respective one of the horizontal positions on said cathode-ray tube where curve data points may be displayed;
   means for shifting any curve data points in said memory means to the next memory location in sequence in said memory means;
   means for transferring said new curve data point signal from said means for producing said new curve data point signal to the initial memory location in said memory means, the procedure of producing a new curve data point, shifting the curve data points in said memory means to the next memory location in sequence, and transferring the new curve data point to the initial memory location in said memory means continuing until a desired horizontal curve has been stored in said memory means;
   means for reading out of said memory means all of the curve data points contained in said memory means in synchronization with each horizontal scan of the raster on said cathode-ray tube;
   means for establishing a signal representative of the vertical position of the current horizontal scan of the raster; and
   means for comparing the curve data point read out of said memory means during the current horizontal scan with the signal representative of the vertical position of the current horizontal scan and applying a video signal to said cathode-ray tube to produce a dot on the screen of said cathode-ray tube when the thus compared signals are equal.

2. Apparatus in accordance with claim 1 wherein a scrolling effect is achieved by alternately shifting the curve data points in said memory means to the next memory location in sequence, entering a new curve data point in the initial memory location of said memory means, and displaying the contents of said memory means.

3. Apparatus in accordance with claim 1 wherein said means for shifting any curve data points in said memory means to the next memory location in sequence in said memory means comprises:
   a trend data latch means;
   an output data latch means;
   means for enabling said memory means to transfer a curve data point to said output data latch means;
   means for enabling said trend data latch means to transfer the data stored in said trend data latch means to the memory location from which the curve data point transferred to said output data latch means was taken; and
   means for enabling said output data latch means to transfer the data in said output data latch means to said trend data latch means.

4. Apparatus in accordance with claim 3 wherein said means for transferring said new curve data point signal from said means for producing said new curve data point signal to the initial memory location in said memory means comprises:
   an input data latch means;
   means for transferring said new curve data point signal from said means for producing said new curve data point signal to said input data latch means; and
   means for enabling said input data latch means to transfer said new curve data point signal to the initial memory location in said memory means.

5. Apparatus in accordance with claim 1 additionally comprising:
   means for establishing a first signal which has a first value when the curve data point read out of said memory means has a value which is less than the value of the signal representative of the vertical position of the current horizontal scan line of the raster and has a second value when the curve data point read out of said memory means has a value which is greater than the value of the signal representative of the vertical position of the current horizontal scan line of the raster;
   means for delaying said first signal one dot position to establish a second signal;
   means for establishing a third signal which has said first value when the curve data point read out of said memory means has a value which is greater than the value of the signal representative of the vertical position of the current horizontal scan line of the raster and has said second value when the curve data point read of said memory means has a value which is less than the value of the signal representative of the vertical position of the current horizontal scan line of the raster;
   an EXCLUSIVE OR gate having first and second inputs and an output;
   means for supplying said second signal to a first input of said EXCLUSIVE OR gate;
   means for supplying said third signal to the second input of said EXCLUSIVE OR gate;
   means for inverting the output of said EXCLUSIVE OR gate to establish a fourth signal, a video signal being applied to said cathode-ray tube to produce a dot on the screen of said cathode-ray tube when said fourth signal has said first value.

6. Apparatus in accordance with claim 4 wherein said first value is a binary 1 and said second value is a binary 0.

7. Apparatus for filling in vertical points in a horizontally oriented curve produced on a raster type cathode-ray tube screen, where a memory is used to store the data points which make up said horizontally oriented curve, comprising:
   means for establishing a first signal which has a first value when a curve data point read out of said memory has a value which is less than the value of a signal representative of the vertical position of the current horizontal scan line of the raster and has a second value when a curve data point read out of said memory has a value which is greater than the value of a signal representative of the vertical position of the current horizontal scan line of the raster;
   means for delaying said first signal one dot position to establish a second signal;
   means for establishing a third signal which has said first value when a curve data point read out of said memory has a value which is greater than the value of a signal representative of the vertical position of the current horizontal scan line of the raster and has said second value when a curve data point read of said memory has a value which is less than the value of a signal representative of the vertical position of the current horizontal scan line of the raster;
   an EXCLUSIVE OR gate having first and second inputs and an output;
   means for supplying said second signal to a first input of said EXCLUSIVE OR gate;
   means for supplying said third signal to the second input of said EXCLUSIVE OR gate;
   means for inverting the output of said EXCLUSIVE OR gate to establish a fourth signal, a video signal being applied to said cathode-ray tube to produce a dot on the screen of said cathode-ray tube when said fourth signal has said first value.

8. Apparatus in accordance with claim 7 wherein said first value is a binary 1 and said second value is a binary 0.

9. A method for producing a horizontally oriented curve on a raster-type cathode-ray tube display, comprising the steps of:
   (a) producing a raster on a cathode-ray tube having horizontal scans alternating with retraces;
   (b) producing a new curve data point signal representative of the vertical height of a dot to be displayed on said cathode-ray tube;
   (c) shifting any curve data points in a memory means to the next memory location in sequence in said memory means, said memory means having a plurality of memory locations corresponding to a respective one of the horizontal positions on said cathode-ray tube where curve data points may be displayed;
   (d) transferring said new curve data point signal to the initial memory location in said memory means;
   (e) repeating steps b–d until a desired horizontal curve has been stored in said memory means;
   (f) reading out of said memory means all of the curve data points contained in said memory means in synchronization with each horizontal scan of the raster on said cathode-ray tube;
   (g) establishing a signal representative of the vertical position of the current horizontal scan of the raster; and
   (h) comparing the curve data point read out of said memory means during the current horizontal scan with the signal representative of the vertical position of the current horizontal scan and applying a video signal to said cathode-ray tube to produce a dot on the screen of said cathode-ray tube when the thus compared signals are equal.

10. A method in accordance with claim 9 for achieving a scrolling effect comprising the steps of:
(i) entering a new data point in said memory means;
(j) displaying the contents of said memory means; and
(k) repeating steps i and j as long as new data points are available.

11. A method in accordance with claim 9 wherein said step of shifting any curve data points in said memory means to the next memory location comprising:
enabling a memory means to transfer a curve data point to an output data latch;
enabling said trend data latch to transfer the data stored in said trend data latch to the memory location from which the curve data point transferred to said output data latch was taken; and
enabling said output data latch to transfer the data in said output data latch to said trend data latch.

12. A method in accordance with claim 11 wherein said step of transferring said new curve data point signal from said means for producing said new curve data point signal to the initial memory location in said memory means comprises:
transferring said new curve data point signal to an input data latch means; and
enabling said input data latch means to transfer said new curve data point signal to the initial memory location in said memory means.

13. A method in accordance with claim 9 additionally comprising:
eastablishing a first signal which has a first value when the curve data point read out of said memory means has a value which is less than the value of the signal representative of the vertical position of the current horizontal scan line of the raster and has a second value when the curve data point read out of said memory means has a value which is greater than the value of the signal representative of the vertical position of the current horizontal scan line of the raster;
delaying said first signal one dot position to establish a second signal;
establishing a third signal which has said first value when the curve data point read out of said memory means has a value which is greater than the value of the signal representative of the vertical position of the current horizontal scan line of the raster and has said second value when the curve data point read of said memory means has a value which is less than the value of the signal representative of the vertical position of the current horizontal scan line of the raster;
supplying said second signal to a first input of an EXCLUSIVE OR gate;
supplying said third signal to the second input of said EXCLUSIVE OR gate;
inverting the output of said EXCLUSIVE OR gate to establish a fourth signal, a video signal being applied to said cathode-ray tube to produce a dot on the screen of said cathode-ray tube when said fourth signal has said first value.

14. A method in accordance with claim 13 wherein said first value is a binary 1 and said second value is a binary 0.

15. A method for filling in vertical points in a horizontally oriented curve produced on a raster type cathode-ray tube screen, where a memory is used to store the data points which make up said horizontally oriented curve, comprising the steps of:
establishing a first signal which has a first value when the curve data point read out of said memory has a value which is less than the value of the signal representative of the vertical position of the current horizontal scan line of the raster and has a second value when the curve data point read out of said memory has a value which is greater than the value of the signal representative of the vertical position of the current horizontal scan line of the raster;
delaying said first signal one dot position to establish a second signal;
establishing a third signal which has said first value when the curve data point read out of said memory has a value which is greater than the value of the signal representative of the vertical position of the current horizontal scan line of the raster and has said second value when the curve data point read of said memory has a value which is less than the value of the signal representative of the vertical position of the current horizontal scan line of the raster;
supplying said second signal to a first input of an EXCLUSIVE OR gate;
supplying said third signal to the second input of said EXCLUSIVE OR gate;
inverting the output of said EXCLUSIVE OR gate to establish a fourth signal, a video signal being applied to said cathode-ray tube to produce a dot on the screen of said cathode-ray tube when said fourth signal has said first value.

16. A method in accordance with claim 15 wherein said first value is a binary 1 and said second value is a binary 0.

* * * * *